(12) United States Patent
Lin et al.

(10) Patent No.: US 11,955,430 B2
(45) Date of Patent: Apr. 9, 2024

(54) METHOD OF MANUFACTURING SEMICONDUCTOR DEVICE AND SEMICONDUCTOR DEVICES

(71) Applicant: TAIWAN SEMICONDUCTOR MANUFACTURING CO., LTD., Hsinchu (TW)

(72) Inventors: Chih-Hsuan Lin, Hsinchu (TW); Hsi Chung Chen, Tainan (TW); Ji-Ling Wu, Hsinchu (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/219,188

(22) Filed: Mar. 31, 2021

(65) Prior Publication Data

US 2022/0319993 A1 Oct. 6, 2022

(51) Int. Cl.
*H01L 23/535* (2006.01)
*H01L 21/3213* (2006.01)
(Continued)

(52) U.S. Cl.
CPC ...... *H01L 23/535* (2013.01); *H01L 21/32136* (2013.01); *H01L 21/76805* (2013.01); *H01L 21/76819* (2013.01); *H01L 21/76825* (2013.01); *H01L 21/76895* (2013.01); *H01L 23/5283* (2013.01); *H01L 23/53257* (2013.01)

(58) Field of Classification Search
CPC ............... H01L 23/535; H01L 23/5283; H01L 23/53257; H01L 21/32136; H01L 21/76805; H01L 21/76819; H01L 21/76825; H01L 21/76895; H01L 23/53209; H01L 23/5226; H01L 23/485; H01L 23/528; H01L 21/76814; H01L 21/7684; H01L 21/02063; H01L 21/02068; H01L 21/31155; H01L 21/3212; H01L 21/32134; H01L 21/76829; H01L 21/76877; H01L 21/823431;
(Continued)

(56) References Cited

U.S. PATENT DOCUMENTS 10,062,560 B1 * 8/2018 Ryan ................. H01L 21/02063
10,510,601 B2 12/2019 Nieh et al.
(Continued)

FOREIGN PATENT DOCUMENTS

CN 112582407 A 3/2021
TW 201842984 A 12/2018
(Continued)

*Primary Examiner* — Shahed Ahmed
*Assistant Examiner* — Vicki B. Booker
(74) *Attorney, Agent, or Firm* — STUDEBAKER & BRACKETT PC

(57) ABSTRACT

A method of manufacturing a semiconductor device includes forming a first dielectric layer over a substrate, forming a metal layer in the first dielectric layer, forming an etch stop layer on a surface of the first dielectric layer and the metal layer, removing portions of the metal layer and the etch stop layer to form a recess in the metal layer, and forming a tungsten plug in the recess. The recess is spaced apart from a bottom surface of the etch stop layer.

20 Claims, 10 Drawing Sheets

(51) Int. Cl.
*H01L 21/768* (2006.01)
*H01L 23/528* (2006.01)
*H01L 23/532* (2006.01)

(58) Field of Classification Search
CPC ......... H01L 21/823475; H01L 27/0886; H01L 2221/1052; H01L 2221/1068
See application file for complete search history.

(56) References Cited

U.S. PATENT DOCUMENTS

| | | |
|---|---|---|
| 10,651,292 B2 | 5/2020 | Cheng et al. |
| 2005/0173799 A1* | 8/2005 | Jou ................... H01L 21/76847 |
| | | 438/758 |
| 2016/0079161 A1* | 3/2016 | Lin ....................... H01L 21/321 |
| | | 438/666 |
| 2020/0343135 A1 | 10/2020 | Huang et al. |
| 2021/0098366 A1 | 4/2021 | Chang et al. |
| 2022/0325418 A1* | 10/2022 | Matsui ................. H01L 21/465 |

FOREIGN PATENT DOCUMENTS

| | | |
|---|---|---|
| TW | 201916255 A | 4/2019 |
| TW | 201935649 A | 9/2019 |
| TW | 202105613 A | 2/2021 |

* cited by examiner

METHOD OF MANUFACTURING SEMICONDUCTOR DEVICE AND SEMICONDUCTOR DEVICES

BACKGROUND

Integrated circuits (ICs) are often designed with active devices such as transistors, resistors and capacitors connected by conductive traces, such as metal lines and polysilicon lines, to form circuits. The active devices in ICs are formed by a photolithographic process that includes use of photoresists, photolithographic masks (masks), specialized light sources and various etchants. Increasingly dense ICs have numerous benefits in terms of speed, functionality and cost, but cause increasingly difficult design and fabrication problems.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1C:
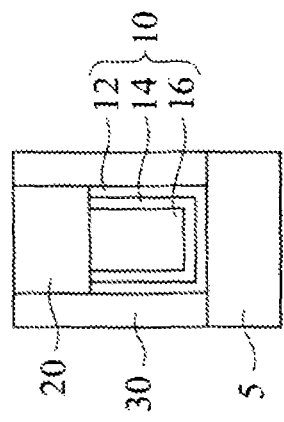
FIGS. 1C and 1D are enlarged views of the gate structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

Over time, increasingly dense ICs incorporating progressively smaller physical dimensions have correspondingly made many aspects of IC design and fabrication challenging using existing methods. The IC fabrication process is often considered to include a front-end-of-line (FEOL) portion, a middle-end-of-line (MEOL) portion, also called a Middle-Of-The-Line (MOL) portion, and a back-end-of-line (BEOL) portion. FEOL is the first portion of IC fabrication wherein individual active devices are patterned on a semiconductor wafer. MEOL processes occur after FEOL processes and include gate contact formation, source/drain contact formation and local interconnect formation processes. BEOL is the final portion of the IC fabrication process where the individual devices (transistors, capacitors, resistors, etc.) are interconnected with vias and conductive traces, e.g., metal lines.

In the fabrication process, conductive patterns are formed in an opening formed in an insulating layer to connect to electronic structures underlying the insulating layer. The conductive pattern is a contact, a via, or a plug. Due to stresses on the conductive pattern, during or after one or more planarization operations, such as a chemical mechanical polishing (CMP) operation, the conductive pattern may break. In other instances, the all or part of the conductive pattern is removed from the opening during or after the planarization operations.

Embodiments of the present disclosure are directed to an improved semiconductor device fabrication process that includes processes to reduce the stress between the insulating layer and the conductive pattern to reduce the damage to the conductive pattern and to improve device performance. The process, according to embodiments of the disclosure, reduce the resistance of the device and improve the current transition times in the device, thereby resulting in faster switching times.

Figure 1D:
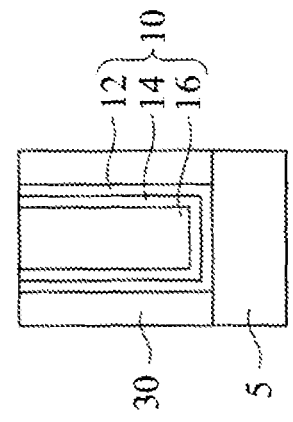
Figure 1A:
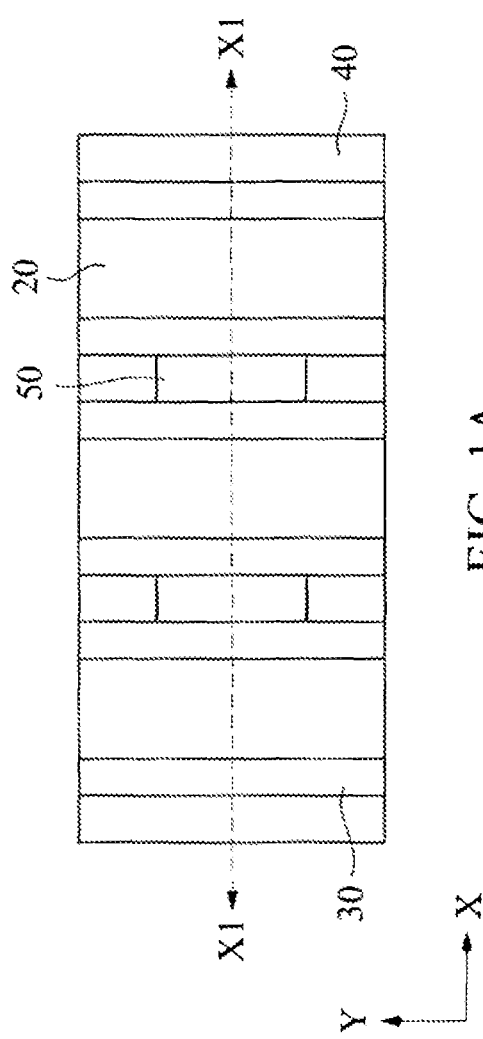
FIG. 1A shows a plan view (viewed from the above) illustrating one of the various stages of a sequential fabrication process of a semiconductor device.
Figure 1B:
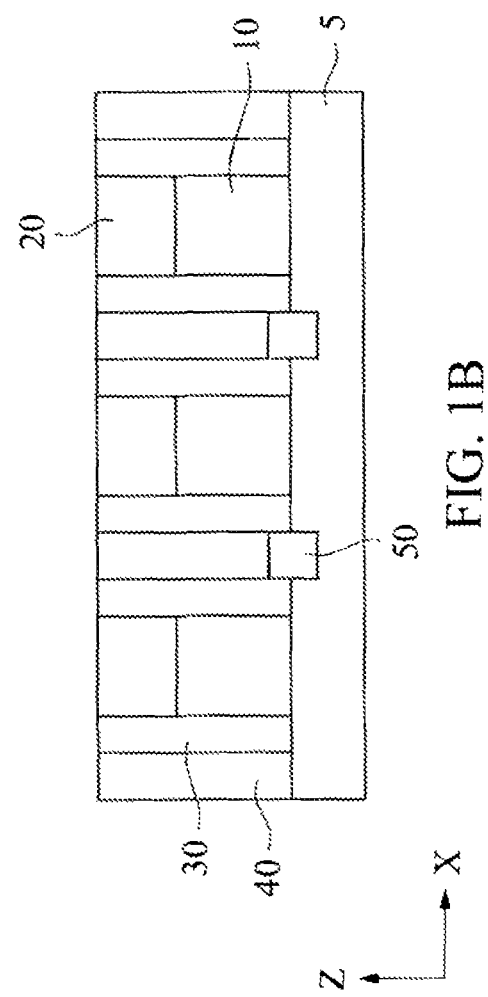
FIG. 1B shows a cross sectional view along line X1-X1 of FIG. 1A.

FIGS. 1A and 1B show one of the stages of a sequential fabrication process of a semiconductor device. FIG. 1A shows a plan (top) view and FIG. 1B shows a cross sectional view along line X1-X1 of FIG. 1A.

FIGS. 1A and 1B show a structure of a semiconductor device after metal gate structures 10 are formed. In FIGS. 1A and 1B, metal gate structures 10 are formed over a channel region of the fin structure 5, for example, a part of a fin structure, and cap insulating layers 20 are disposed over the metal gate structures 10. The thickness of the metal gate structures 10 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. Sidewall spacers 30 are provided on sidewalls of metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 8 nm in other embodiments. The combination of the metal gate structure 10, the cap insulating layer 20 and sidewall spacers 30 may be collectively referred to as a gate structure. Further, source/drain regions 50 are formed adjacent to the gate structures, and spaces between the gate structures are filled with an interlayer dielectric (ILD) layer 40.

FIG. 1C is an enlarged view of the gate structure. The metal gate structure 10 includes one or more layers 16 of metal material, such as Al, Cu, W, Ti, Ta, TiN, TiAl, TiAlC, TiAlN, TaN, NiSi, CoSi, other conductive materials. A gate dielectric layer 12 disposed between the channel region of the fin structure 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 (MG) are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The sidewall spacer 30 is made of a different material than the cap insulating layer 20 and includes one or more layers of insulating material such as silicon nitride based material including SiN, SiON, SiCN and SiOCN. The ILD layer 40 includes one or more layers of insulating material such as silicon oxide based material such as silicon dioxide ($SiO_2$) and SiON.

In some embodiments, no gate cap insulating layer is formed, as shown in FIG. 1D.

The material of the sidewall spacer 30, the material of the cap insulating layer 20, and a material of the ILD layer 40 are different from each other, so that each of these layers can be selectively etched. In one embodiment, the sidewall spacer 30 is made of SiOCN, SiCN or SiON, the cap insulating layer 20 is made of SiN, and the ILD 40 layer is made of SiO2.

In this embodiment, fin field effect transistors (Fin FETs) fabricated by a gate-replacement process are employed.

Figure 1E:
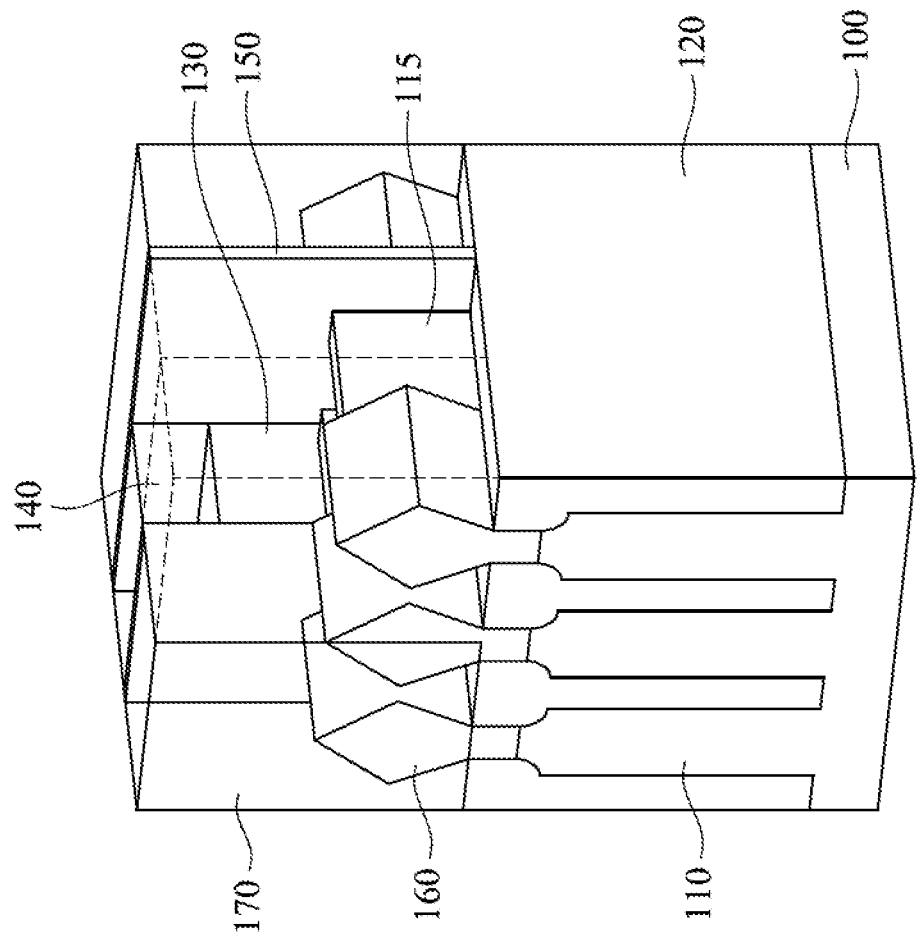
FIG. 1E shows a perspective view illustrating one of the various stages of a sequential fabrication process of a semiconductor device.

FIG. 1E shows an exemplary perspective view of a Fin FET structure.

First, a fin structure 110 is fabricated over a substrate 100. The fin structure 110 includes a bottom region and an upper region as a channel region 115. The substrate 100 is, for example, a p-type silicon substrate with an impurity concentration in a range from about $1 \times 10^{15}$ $cm^{-3}$ to about $1 \times 10^{18}$ $cm^{-3}$. In other embodiments, the substrate 100 is an n-type silicon substrate with an impurity concentration in a range from about $1 \times 10^{15}$ $cm^{-3}$ to about $1 \times 10^{18}$ $cm^{-3}$. Alternatively, the substrate 100 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 100 is a silicon layer of an SOI (silicon-on-insulator) substrate.

After forming the fin structure 110, an isolation insulating layer 120 is formed over the fin structure 110. The isolation insulating layer 120 includes one or more layers of insulating materials such as silicon oxide, silicon oxynitride or silicon nitride, formed by LPCVD (low pressure chemical vapor deposition), plasma-CVD or flowable CVD. The isolation insulating layer 120 may be formed by one or more layers of spin-on-glass (SOG), SiO, SiON, SiOCN and/or fluorine-doped silicate glass (FSG).

After forming the isolation insulating layer 120 over the fin structure 110, a planarization operation is performed so as to remove part of the isolation insulating layer 120. The planarization operation may include a chemical mechanical polishing (CMP) and/or an etch-back process. Then, the isolation insulating layer 120 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers including one or more layers of insulating materials are also formed on sidewalls of the dummy gate electrode layer. After the dummy gate structure is formed, the fin structure 110 not covered by the dummy gate structure is recessed below the upper surface of the isolation insulating layer 120. Then, a source/drain region 160 is formed over the recessed fin structure 110 by using an epitaxial growth method. The source/drain region may include a strain material to apply stress to the channel region 115.

A dummy gate structure is formed over the exposed fin structure. The dummy gate structure includes a dummy gate electrode layer made of poly silicon and a dummy gate dielectric layer. Sidewall spacers including one or more layers of insulating materials are also formed on sidewalls of the dummy gate electrode layer. After the dummy gate structure is formed, the fin structure 110 not covered by the dummy gate structure is recessed below the upper surface of the isolation insulating layer 120. Then, a source/drain region 160 is formed over the recessed fin structure by using an epitaxial growth method. The source/drain region may include a strain material to apply stress to the channel region 115.

Then, an interlayer dielectric layer (ILD) 170 is formed over the dummy gate structure and the source/drain region. After a planarization operation, the dummy gate structure is removed so as to make a gate space. Then, in the gate space, a metal gate structure 130 including a metal gate electrode and a gate dielectric layer, such as a high-k dielectric layer, is formed. Further, the cap isolation layer 140 is formed over the metal gate structure 130, so as to obtain the Fin FET structure shown in FIG. 1E. In FIG. 1E, parts of the metal gate structure 130, the cap isolation layer 140, sidewalls 150 and the ILD 170 are cut to show the underlying structure.

The metal gate structure 130, the cap isolation layer 140, sidewalls 150, source/drain 160 and the ILD 170 of FIG. 1E substantially correspond to the metal gate structures 10, cap insulating layers 20, sidewall spacers 30, source/drain regions 50 and interlayer dielectric layer (ILD) 40, of FIGS. 1A-1D, respectively. In some embodiments, one or more ILD layer is additionally formed over the ILD layer 40, thereby forming a first ILD layer 45.

FIGS. 2A-2E show the stages of a sequential fabrication process of a semiconductor device corresponding to the structure. In FIGS. 2A-2E, four fin structures 5 are shown, but the number of the fin structures 5 is not limited to four, and can be one, two, three or five or more.

Figure 2B:
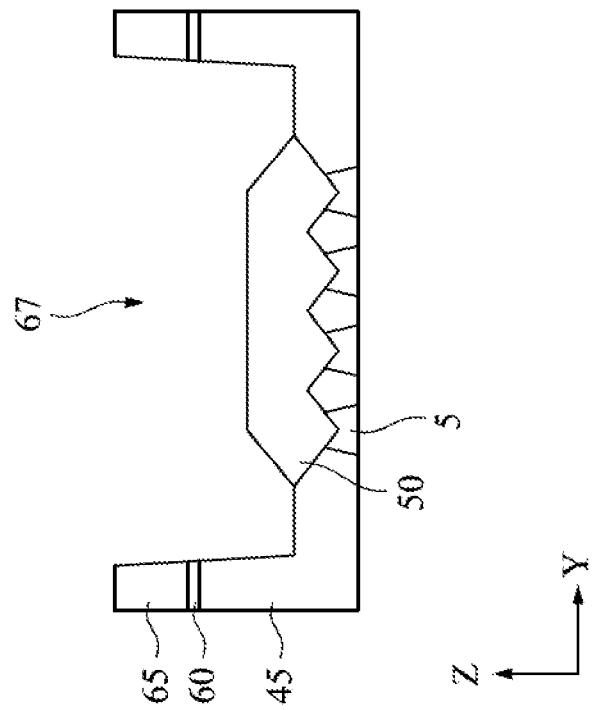
FIGS. 2A, 2B, 2C, 2D and 2E show cross sectional views of various stages of the sequential fabrication process of a semiconductor device.
Figure 2A:
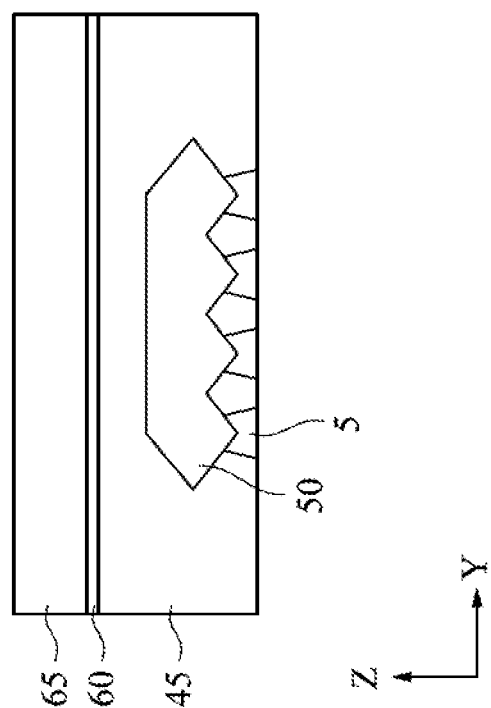

After the metal gate structure is formed, the first etch stop layer 60 is formed over the first ILD layer 45 (or 40), and the second ILD layer 65 is formed over the first etch stop layer 60, as shown in FIG. 2A. The etch stop layer and the ILD layer are formed by suitable film formation methods, such as CVD, physical vapor deposition (PVD) or atomic layer deposition (ALD).

By using one or more lithography and etching operations, a contact hole (opening) 67 for the lower contact 70 is formed in the first and second ILD layers 45, 65, as shown in FIG. 2B.

Figure 2C:
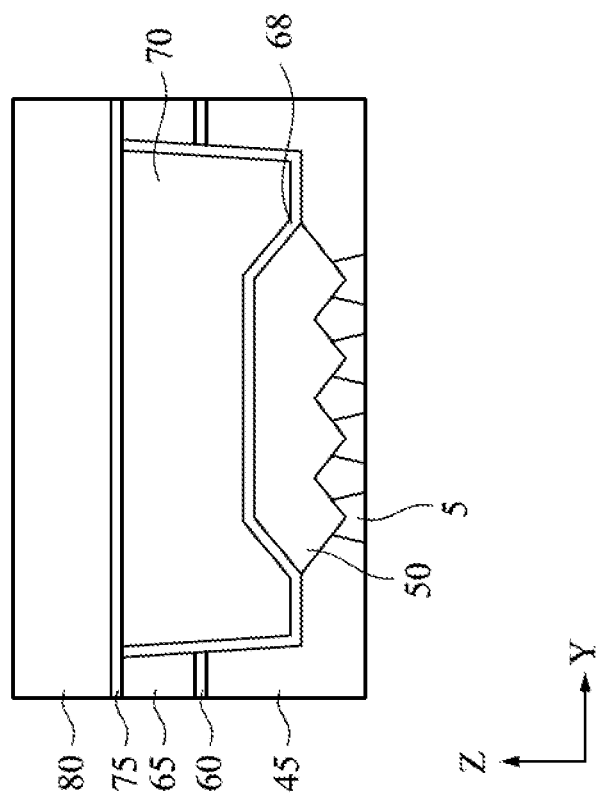

Then, the first contact liner layer 68 is conformally formed in the contact hole 67 and on the upper surface of the second ILD layer 65, and a conductive material is formed over the first contact liner layer 68. The contact liner layer 68 and the conductive material layer are formed by suitable film formation methods, such as CVD, PVD, ALD or plating. Subsequently, a planarization operation, such as an etch back operation or a chemical mechanical polishing (CMP) operation, is performed to form the source/drain contact 70, as shown in FIG. 2C.

Figure 2D:
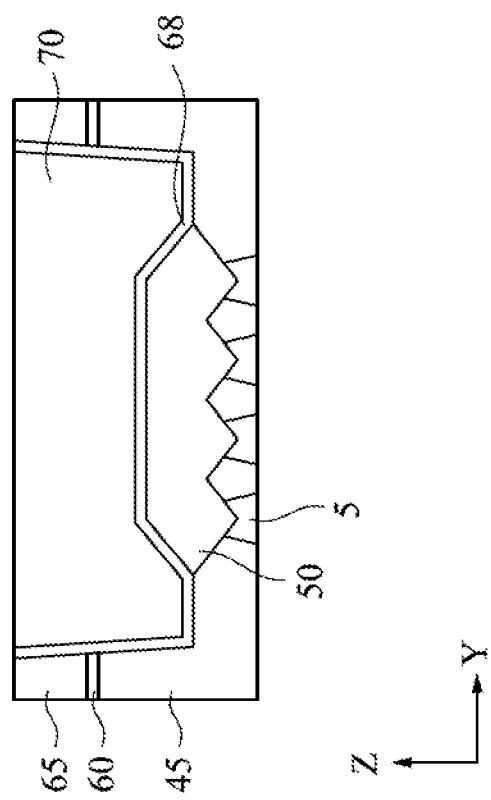

Subsequently, a second etch stop layer 75 and the third ILD layer 80 are formed, as shown in FIG. 2D. In some embodiments, the third ILD layer 80 is doped with Ge and/or Sn formed by in-situ doping in a deposition process. In other embodiments, after the third ILD layer 80 is formed, an ion implantation operation is performed to introduce Ge and/or Sn into the third ILD layer 80. In other embodiments, the implantation operation is performed at a later stage of the manufacturing operation.

Figure 2E:
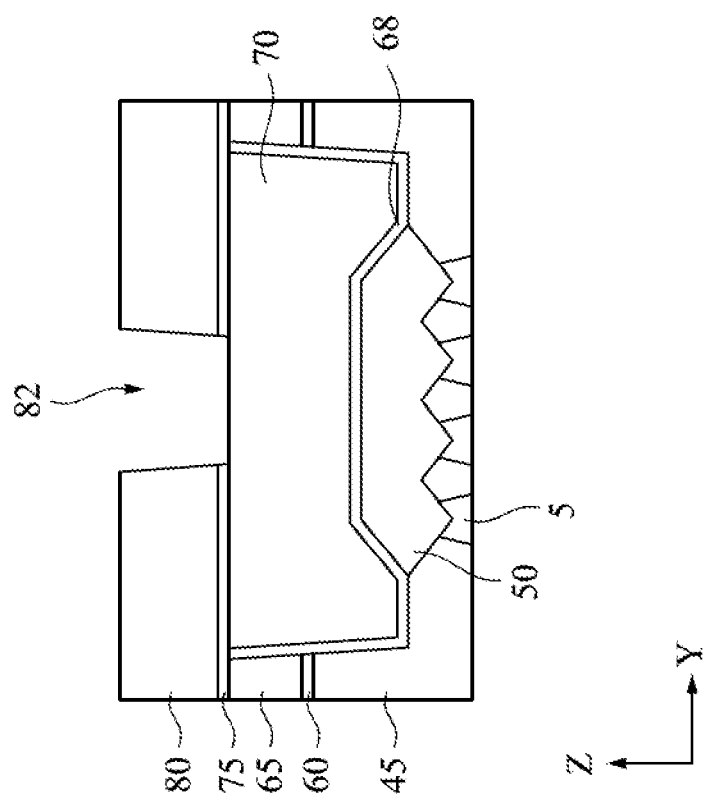

As shown in FIG. 2E, by using one or more lithography and etching operations, a contact hole (opening) 82 for the upper contact is formed in the third ILD layer 80 and the second etch stop layer 75.

FIGS. 3A, 3B, 3C, 3D, and 3E illustrate various stages of a sequential manufacturing operation of a semiconductor device according to the present disclosure. It is understood that additional operations can be provided before, during, and after the operations of FIGS. 3A-3E, and some of the operations described below can be replaced or eliminated, for additional embodiments of the method. The order of the operations/processes may be interchangeable, or two or more operations can be performing simultaneously. Materials, configurations, dimensions and/or processes as described with respect to FIGS. 1A-2E are applied to the following embodiments, and the detailed description thereof may be omitted.

Figures 3A, 3B, 3C:
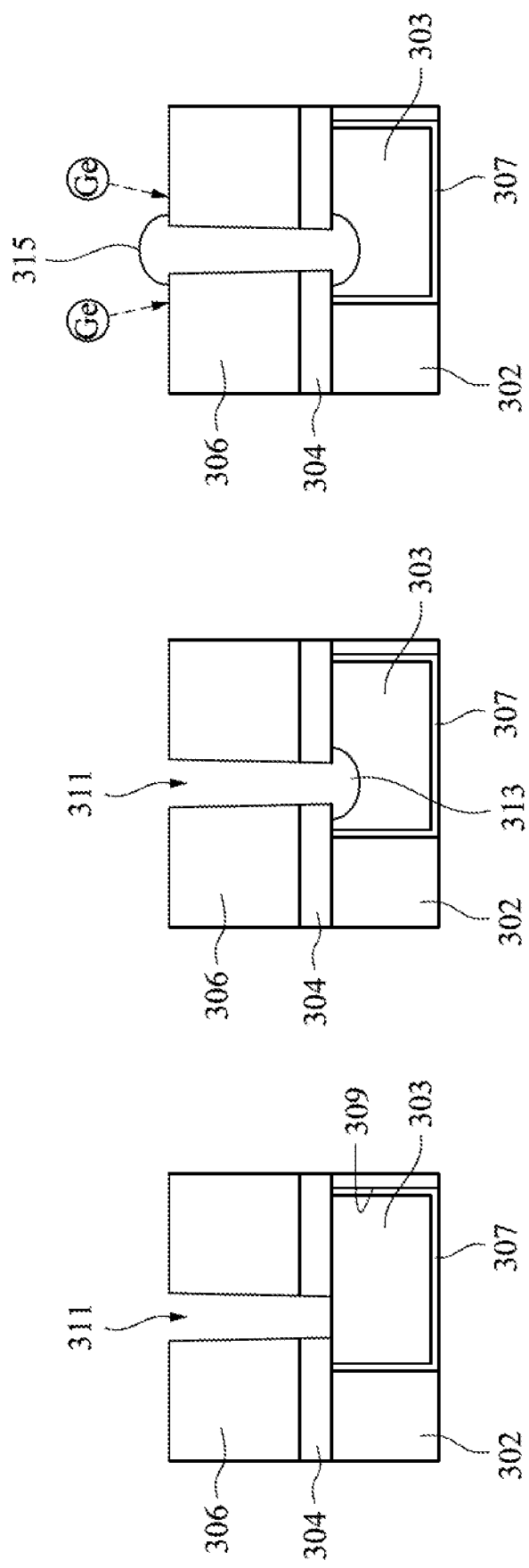
FIGS. 3A, 3B, 3C, 3D and 3E illustrate various stages of a sequential manufacturing operation of a semiconductor device according to the present disclosure.

As shown in FIG. 3A, a first interlayer dielectric (ILD) layer 302 (e.g., corresponding to layers 45, 65 in FIG. 2E) is formed over an underlying structure (not shown) on a semiconductor substrate (not shown). In some embodiments, the underlying structure includes one or more fin structures that are formed over a semiconductor substrate. In some embodiments, the first interlayer dielectric (ILD) layer 302 is an insulating layer, such as silicon oxynitride or silicon oxide. The first interlayer dielectric (ILD) layer 302 is formed by chemical vapor deposition (CVD), including low pressure CVD (LPCVD) and plasma enhanced CVD (PECVD), physical vapor deposition (PVD), atomic layer deposition (ALD), or other suitable process.

In some embodiments, a metal layer 303 (e.g., corresponding to contact 70 in FIG. 2E) is formed in the first interlayer dielectric (ILD) layer 302. In some embodiments, the metal layer 303 includes cobalt. In some embodiments, one or more glue layers 307 are conformally formed in the opening in the first interlayer dielectric (ILD) layer 302 before the metal layer 303 is formed. In some embodiments, the glue layer 307 includes titanium, titanium nitride, tantalum and/or tantalum nitride.

After the metal layer 303 is formed, an etch stop layer 304 (e.g., corresponding to layer 75 in FIG. 2E) is formed over the first interlayer dielectric (ILD) layer 302. A second interlayer dielectric (ILD) layer 306 (e.g., corresponding to layer 80 in FIG. 2E) is formed over the etch stop layer 304. The etch stop layer 304 and the second interlayer dielectric (ILD) layer 306 are formed by suitable film formation methods, such as CVD, PVD or ALD. In some embodiments, the etch stop layer 304 includes a nitride-based insulating material. In some embodiments, the nitride-based insulating layer is nitride or oxynitride of silicon, germanium, or silicon germanide (SiGe). In some embodiments, the nitride-based insulating material includes silicon nitride and silicon oxynitride. In case of silicon oxynitride, the amount of nitrogen is greater than the amount of oxygen in some embodiments ($Si_xO_yN_z$, where $y<z$).

By using one or more lithography and dry etching operations, an opening (via) 311 is formed in the second interlayer dielectric (ILD) layer 306 and the etch stop layer 304. The opening 311 exposes an upper surface of the metal layer 303. In some embodiments, an oxide layer (e.g., cobalt oxide) is formed on the exposed surface of the metal layer 303.

Referring to FIG. 3B, a wet etching operation is performed for substantially isotropically removing a portion of the metal layer 303 below the opening 311, thereby forming a recess 313 (e.g., cobalt recess) in the metal layer 303. Because of the isotropic nature of the wet etching operation, the recess 313 that is formed extends laterally and in a vertically downward direction. The recess 313 extends laterally below the etch stop layer 304 and a part of the bottom surface of the etch stop layer 304 about the opening 311 is exposed. In some embodiments, an aqueous solution of $H_2SO_4$ is used as a wet etchant. When an oxide layer is formed on the upper surface of the metal layer 303, the wet etching operation also removes the oxide layer in some embodiments.

As illustrated in FIG. 3C, in some embodiments, a conductive material, such as tungsten, is deposited in the opening 311 and the recess 313 to form a tungsten plug 315. The tungsten plug 315 occupies (fills) the opening 311 and the recess 313. The tungsten material forms a "bump" on the upper surface of the second interlayer dielectric (ILD) layer 306. The tungsten plug 315 is formed by suitable film formation methods, such as CVD, PVD, or ALD. In some embodiments, the tungsten deposition is selective deposition and is grown from the cobalt recess 313.

After the tungsten plug 315 is formed, germanium (Ge) is implanted in the second interlayer dielectric (ILD) layer 306. The germanium occupies the gaps between the sidewalls forming the opening 311 and the outer surface of the tungsten plug 315. As such, the gaps are reduced and the displacement of the tungsten plug 315 in the opening 311 is reduced. The recess 313 also limits the movement of the tungsten plug 315. For instance, further operations (e.g., polishing operations) can cause displacement of the tungsten plug 315 in the opening 311 if the gaps are not filled. The germanium (Ge) ions filling the gaps limit displacement, thereby reduce damage of the tungsten plug 315. In some embodiments, a concentration of Ge is in a range from about 1 atomic % to 20 atomic %, and is in a range from about 5 atomic % to about 10 atomic % in other embodiments. In some other embodiments, other materials like Sn are implanted.

Figure 3E:
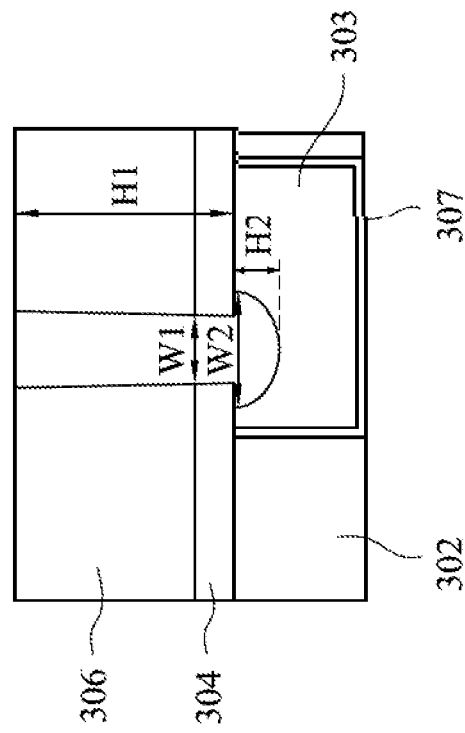
Figure 3D:
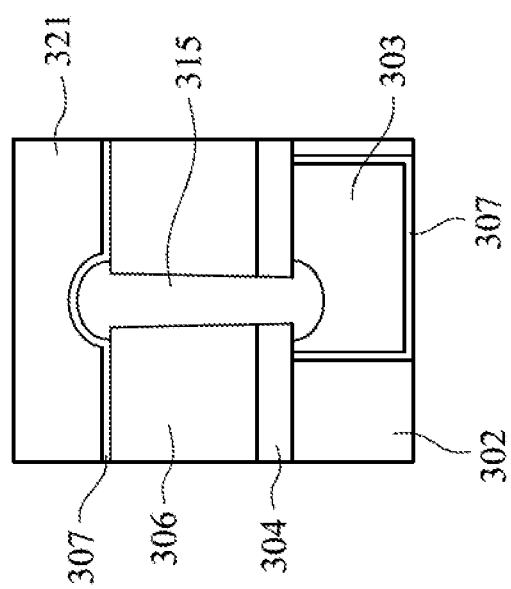

In some embodiments, one or more glue layers 307 (and/or barrier layers) are formed on the upper surface of the second interlayer dielectric (ILD) layer 306 and the tungsten plug 315, as illustrated in FIG. 3D. A buffing layer 321 is applied over the glue layers 307. In some embodiments, the buffing layer 321 includes tungsten. In some embodiments, the glue layer 307 improves adhesion of the buffer layer 321 on the ILD layer 306. In some embodiments, the buffering layer 321 and/or the combination of the glue layer 307 and the buffering layer 321 helps to reduce stress in a subsequent CMP operation and thus to reduce breakage of the tungsten plug 315 due to different CMP stress of the tungsten plug 315 and the ILD layer 306 (silicon oxide).

The buffing layer 321 reduces stresses induced on the surface of the second interlayer dielectric (ILD) layer 306 during subsequent polishing operations. The buffing layer 321 also reduces the contact stress between the second ILD layer 306 and the tungsten plug 315, and thereby limits damage of the tungsten plug 315. FIG. 3E illustrates the structure obtained after chemical mechanical polishing (CMP) is performed to remove the buffing layer 321, the glue layers 307 and portions of the second ILD layer 306.

Referring to FIG. 3E, a distance H1 represents the vertical distance between the upper surface of the second interlayer dielectric (ILD) layer 306 and the upper surface of the metal layer 303, a distance H2 represents the height of the recess 313 from the upper surface of the metal layer 303 to the lowest point in the recess 313, a width W1 represents the width of the opening 311, and a width W2 represents the width of the recess 313 at the widest point. In some embodiments, the distance H1 is from around 200 nm to around 500 nm, the distance H2 is from around 5 nm to around 15 nm, the width W1 is from around 10 nm to around 20 nm, and the width W2 is from around 15 nm to around 25 nm. In some embodiments, the aspect ratio $H_1/W_1$ is around 12 to around 100. In some embodiments, the aspect ratio $H_2/W_2$ is around 0.2 to around 2. Tungsten plugs having dimensions less than the lower range values (e.g., H1 less than 200 nm, or H2 less than 5 nm, etc.) mentioned above, will be relatively weak structures and will be damaged easily during operations such as chemical mechanical polishing (CMP). Tungsten plugs having dimensions larger than the higher range values (e.g., H1 greater than 500 nm, H2 greater than 15 nm, etc.) mentioned above, will be more deeper and wider, and will occupy more space in the substrate.

FIGS. 4A-4I illustrate various stages of a sequential manufacturing operation of a semiconductor device according to the present disclosure. It is understood that additional operations can be provided before, during, and after the operations of FIGS. 4A-4I, and some of the operations described below can be replaced or eliminated, for additional embodiments of the method. The order of the operations/processes may be interchangeable, or two or more operations can be performing simultaneously. Materials, configurations, dimensions and/or processes as described with respect to FIGS. 1A-2E are applied to the following embodiments, and the detailed description thereof may be omitted.

Figure 4A:
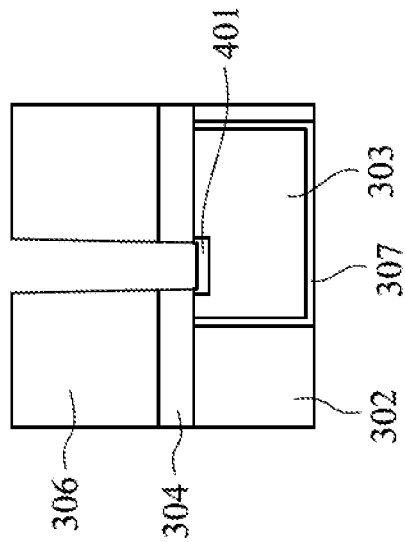
FIGS. 4A, 4B, 4C, 4D, 4E, 4F, 4G, 4H and 4I illustrate various stages of a sequential manufacturing operation of a semiconductor device according to the present disclosure.

As shown in FIG. 4A, a first interlayer dielectric (ILD) layer 302 is formed over an underlying structure (not shown) on a semiconductor substrate (not shown). In some embodiments, the underlying structure includes one or more fin structures that are formed over a semiconductor substrate. In some embodiments, the first interlayer dielectric (ILD) layer 302 is an insulating layer, such as silicon oxynitride or silicon oxide. The first interlayer dielectric (ILD) layer 302 is formed by chemical vapor deposition (CVD), including low pressure CVD (LPCVD) and plasma enhanced CVD (PECVD), physical vapor deposition (PVD), atomic layer deposition (ALD), or other suitable process.

In some embodiments, a metal layer 303 is formed in the first interlayer dielectric (ILD) layer 302. In some embodiments, the metal layer 303 includes cobalt. In some embodiments, one or more glue layers 307 are conformally formed in the opening in the first interlayer dielectric (ILD) layer 302 before the metal layer 303 is formed. In some embodiments, the glue layer 307 includes titanium, titanium nitride, tantalum and/or tantalum nitride.

After the metal layer 303 is formed, an etch stop layer 304 is formed over the first interlayer dielectric (ILD) layer 302. A second interlayer dielectric (ILD) layer 306 is formed over the etch stop layer 304. The etch stop layer 304 and the second interlayer dielectric (ILD) layer 306 are formed by suitable film formation methods, such as CVD, PVD or ALD. In some embodiments, the etch stop layer 304 includes a nitride-based insulating material. In some embodiments, the nitride-based insulating layer is nitride or oxynitride of silicon, germanium, or silicon germanide (SiGe). In some embodiments, the nitride-based insulating material includes silicon nitride and silicon oxynitride. In case of silicon oxynitride, the amount of nitrogen is greater than the amount of oxygen in some embodiments ($Si_xO_yN_z$, where y<z).

By using one or more lithography and dry etching operations, an opening (via) 311 is formed in the second interlayer dielectric (ILD) layer 306 and the etch stop layer 304. The opening 311 exposes an upper surface of the metal layer 303.

Figure 4B:
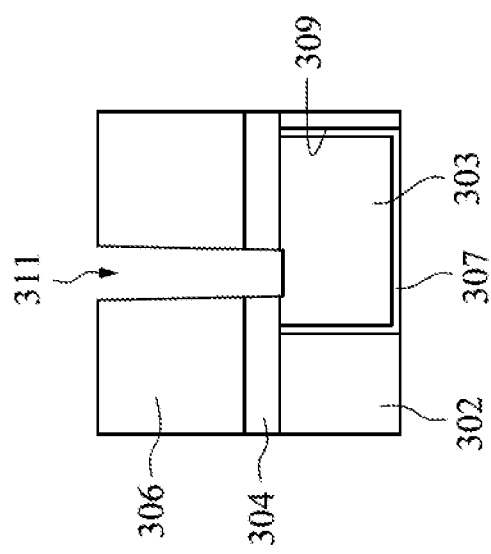

As illustrated in FIG. 4B, the surface of the cobalt metal layer 303 get oxidized after some time (around 30 minutes) due to exposure to the environment, and one or more layers 401 of cobalt oxide $Co_3O_4$ are formed on the surface of the metal layer 303 (or, in other words, at the bottom of the opening 311). It is desirable to further extend the opening 311 into the metal layer 303 to provide improved support for a plug that is formed in the opening 311. In order to make the opening 311 deeper, the metal layer 303 is etched further. The one or more layers 401 of cobalt oxide $Co_3O_4$ limit further etching of the metal layer 303.

Figure 4C:
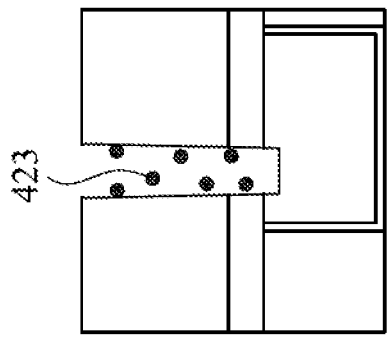

As illustrated in FIG. 4C, a thermal dry etching process is performed in which the one or more layers 401 of cobalt oxide $Co_3O_4$ are exposed to an etching agent for substantially anisotropically removing the one or more layers 401 of cobalt oxide $Co_3O_4$. After the one or more layers 401 of cobalt oxide $Co_3O_4$ are removed, the thermal dry etching process is continued to remove portions of the metal layer 303, and thereby make the opening 311 "deeper". In some embodiments, nitrogen trifluoride ($NF_3$) gas (or other fluoride containing gases) is used as an etching agent. The reaction between the cobalt oxide $Co_3O_4$ and the nitrogen trifluoride gas releases cobalt difluoride $CoF_2$ gas.

Figure 4D:
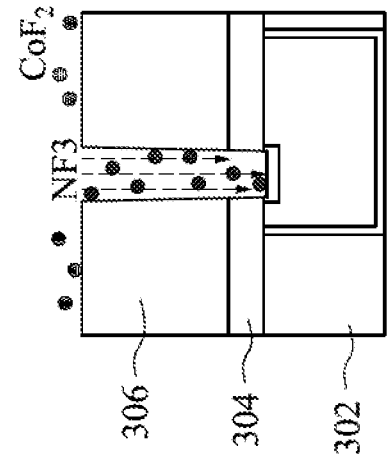

After the metal layer 303 has been etched a desired distance (e.g., height H4 in FIG. 4J) from the bottom of the etch stop layer 304, the etching operation is stopped by removing the etching agent from the opening 311. As illustrated in FIG. 4D, a defluorination process is performed by introducing a defluorination agent 423 to remove the fluoride from the opening 311. In some embodiments, argon (Ar) or hydrogen ($H_2$) plasmas are used for defluorination. In some other embodiments, oxygen ($O_2$) plasma is used.

Figure 4E:
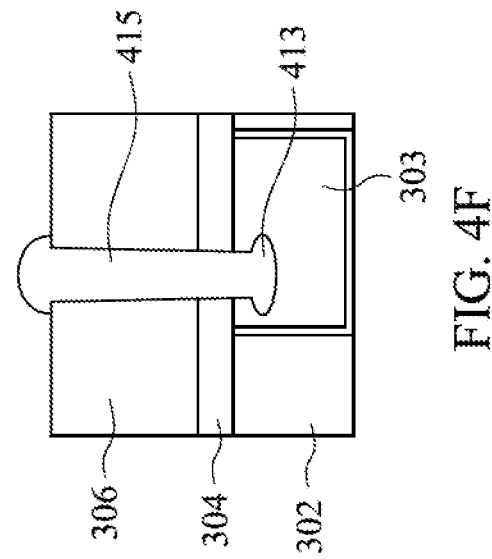

As illustrated in FIG. 4E, a wet etching operation is performed for substantially isotropically removing the cobalt in the metal layer 303. Using the wet etching operation, the metal layer 303 is etched in laterally and vertically downward directions, creating a recess 413 that is wider that the opening 311 (e.g., width W4 is greater than width W3, see FIG. 4J). Because the thermal dry etching process also removes portions of the metal layer 303, the recess 413 is vertically spaced from the etch stop layer 304. For the purposes of discussion herein, "spaced", indicates a distance or gap between the etch stop layer 304 and the recess 413 such that the recess 413 does not contact the etch stop layer 304. In contrast, the recess 313 (FIG. 3B) contacts the etch stop layer 304.

Figure 4F:
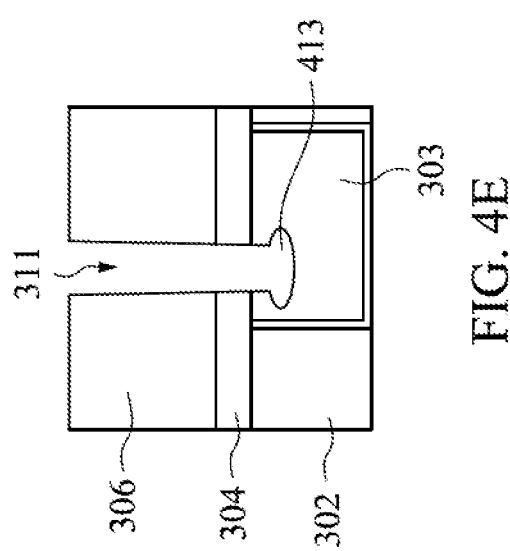

As illustrated in FIG. 4F, in some embodiments, a conductive material, such as tungsten, is deposited in the opening 311 and the recess 413 to form a tungsten plug 415. The tungsten plug 415 occupies (fills) the opening 311 and the recess 413. The tungsten material forms a "bump" on the upper surface of the second interlayer dielectric (ILD) layer 306. The tungsten plug 415 is formed by suitable film formation methods, such as CVD, PVD, or ALD. In some embodiments, the tungsten deposition is selective deposition and is grown from the cobalt recess 313.

Figure 4G:
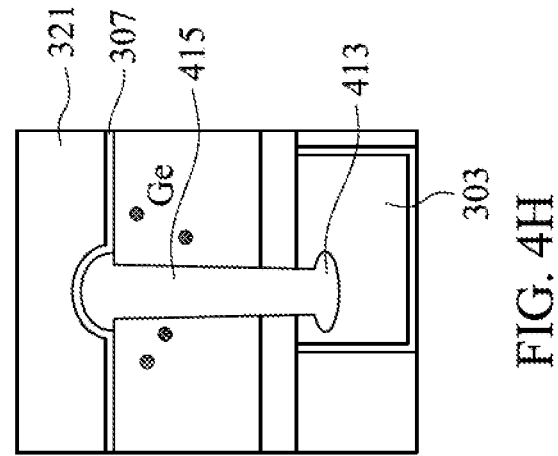

Referring to FIG. 4G, after the tungsten plug 415 is formed, an implantation operation is performed using germanium (Ge). The germanium occupies the gaps between the sidewalls of the opening 311 and the outer surface of the tungsten plug 415. As such, the gaps are "filled" and the displacement of the tungsten plug 415 in the opening 311 is reduced. The deeper recess 413 further limits the movement of the tungsten plug 415. For instance, further operations (e.g., polishing operations) can cause displacement of the tungsten plug 415 in the opening 311 if the gaps are not filled. The germanium (Ge) filling the gaps can limit displacement, and thereby reduce damage to the tungsten plug 415.

Figure 4H:
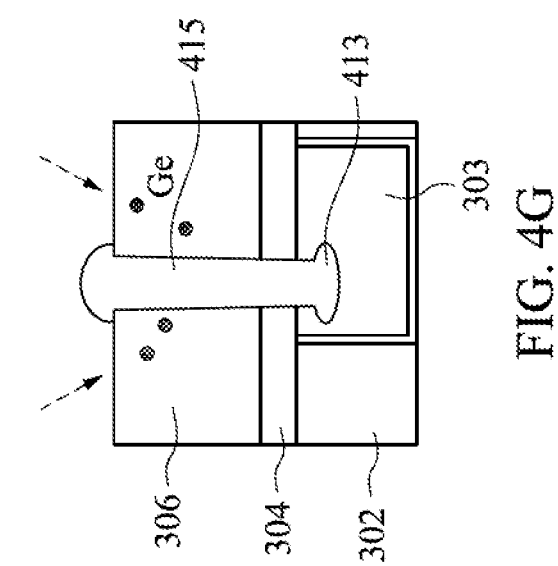

In some embodiments, one or more glue layers 307 (and/or barrier layers) are formed on the upper surface of the second interlayer dielectric (ILD) layer 306 and the tungsten plug 415, as illustrated in FIG. 4H. A buffing layer 321 is applied over the glue layers 307. In some embodiments, the buffing layer 321 is made of tungsten and the glue layer 307 includes Ti and TiN.

The buffing layer 321 reduces stresses induced on the surface of the second interlayer dielectric (ILD) layer 306 during subsequent cleaning operations. The buffing layer 321 also reduces the contact stress between the second interlayer dielectric (ILD) layer 306 and the tungsten plug 415, and thereby limits damage to the tungsten plug 415.

Figure 4J:
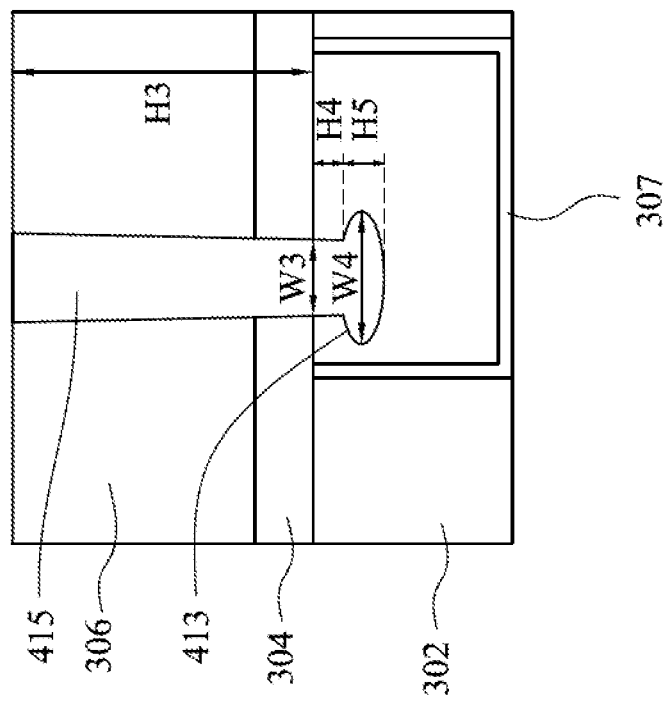
FIG. 4J illustrates the structure obtained after the processing method in FIGS. 4A-4I.
Figure 4I:
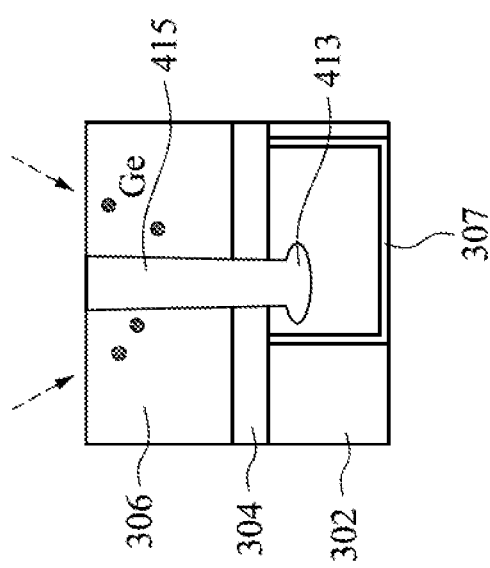

A chemical mechanical polishing (CMP) is performed to remove the buffing layer 321, the glue layers 307, the tungsten plug 415, and portions of the second interlayer dielectric (ILD) layer 306, as illustrated in FIG. 4I.

After the tungsten plug 415, and the second interlayer dielectric (ILD) layer 306 have been polished, a second implantation operation is performed to implant germanium (Ge) in the gaps between the sidewalls of the opening 311 and the outer surface of the tungsten plug 415. Because the recess 413 is deeper compared to the recess 313, the first Ge implantation may not be sufficient to fill the gaps. The second implantation operation fills the gaps not filled by the first implantation operation and thus further secures the tungsten plug 415. In some embodiments, the depth (H4) of the recess 413 may be less (e.g., around 1-2 nm), and the second implantation operation is omitted. In some embodiments, in the first implantation operation as explained with FIG. 4G, the germanium is implanted into about 20-40% of the thickness of the ILD layer 306 from the upper surface of the ILD layer 306. After the one or more CMP operations as explained above, the thickness of the ILD layer 306 is reduced by about 20-40% of the thickness of the ILD layer 306, which means that the Ge implanted region of the ILD layer 306 is substantially removed. By using the second implantation operation, germanium ions can be implanted again to about 15-35% of the thickness of the remaining ILD layer.

FIG. 4J illustrates the structure obtained after the processing steps discussed above. Referring to FIG. 4J, a distance H3 represents the vertical distance between the upper surface of the second interlayer dielectric (ILD) layer 306 and the upper surface of the metal layer 303, a distance H4 represents the distance of the recess 413 from the upper surface of the metal layer 303, a distance H5 represents the height of the recess 413 at the highest point, a width W3 represents the width of the opening 311, and a width W4 represents the width of the recess 413 at the widest point. In some embodiments, the distance H3 is from around 200 nm to around 500 nm, the distance H5 is from around 3 nm to around 10 nm, the width W3 is from around 10 nm to around 20 nm, and the width W4 is from around 15 nm to around 25 nm. The distance H4 is a value greater than 0. In some embodiments, H4 is around 1 nm to around 10 nm. However, the value of H4 can be varied as required by application and design. In some embodiments, the aspect ratio H3/W3 is around 12 to around 100. In some embodiments, the aspect ratio H5/W4 is around 0.2 to around 2. Tungsten plugs having dimensions less than the lower range values (e.g., H3 less than 200 nm, or H5 less than 3 nm, etc.) mentioned above, will be relatively weak structures and will be damaged easily during operations such as chemical mechanical polishing (CMP). Tungsten plugs having dimensions larger than the higher range values (e.g., H3 greater than 500 nm, H5 greater than 10 nm, etc.) mentioned above, will be more deeper and wider, and will occupy more space in the substrate.

The processing method, according to embodiments of the disclosure, reduces the fluoride content in the cobalt layer in an etching operation to obtain a recess in the cobalt layer of a desired dimension (e.g., depth and width). The tungsten plug formed in the recess has a reduced resistance and improved switching speed.

It will be understood that not all advantages have been necessarily discussed herein, no particular advantage is required for all embodiments or examples, and other embodiments or examples may offer different advantages.

In accordance with one aspect of the present disclosure, a method of manufacturing a semiconductor device includes forming a first dielectric layer over a substrate, forming a metal layer in the first dielectric layer, forming an etch stop layer on a surface of the first dielectric layer and the metal layer, removing portions of the metal layer and the etch stop layer to form a recess in the metal layer, the recess being spaced apart from a bottom surface of the etch stop layer, and forming a tungsten plug in the recess. In some embodiments, the metal layer includes cobalt, and first portions of the metal layer at or near a surface of the metal layer include an oxide of cobalt. The method further includes performing an etching operation using a fluoride containing gas to remove the first portions of the metal layer and remove second portions of the metal layer below the first portion to form the recess, and performing a defluorination process to remove the fluoride containing gas after the recess has been formed a desired distance into the metal layer. In some embodiments, the method further includes, prior to etching, forming a second dielectric layer on the etch stop layer, and removing portions of the second dielectric layer and the etch stop layer to form an opening. The recess is formed in the metal layer through the opening. In some embodiments, the method further includes performing a first ion implantation operation to implant an ion species in the second dielectric layer; and performing a planarization operation on the second dielectric layer and the tungsten plug. In some embodiments, the method further includes forming a buffing layer on the second dielectric layer prior to performing the planarization operation. In some embodiments, the method further includes performing a second ion implantation operation to implant the ion species in the second dielectric layer. In some embodiments, etching the first portions and the second portions extends the opening into the metal layer. In some embodiments, the defluorination process is performed using plasmas of argon (Ar), hydrogen ($H_2$), or oxygen ($O_2$). In some embodiments, removing portions of the metal layer includes performing a first etching operation to remove first portions of the metal layer at or near the surface of the metal layer, removing second portions of the metal layer below the first portions to extend the opening into metal layer, and forming the recess in the metal layer. In some embodiments, the metal layer includes cobalt and the first portions of the metal layer at or near the surface of the metal layer include an oxide of cobalt. In some embodiments, performing the first etching operation includes treating the oxide of cobalt with a fluoride containing gas, and the method further includes performing a defluorination process to remove the fluoride containing gas from the opening after the opening has been extended into the metal layer a desired distance.

In accordance with another aspect of the present disclosure, a method of manufacturing a semiconductor device includes forming a first dielectric layer over a substrate, forming a cobalt plug in the first dielectric layer, forming a nitride based etch stop layer on the first dielectric layer and the cobalt plug, forming a second dielectric layer over the nitride based etch stop layer, forming an opening in the second dielectric layer and the nitride based etch stop layer to expose an upper surface of the cobalt plug, performing an etching operation using a fluoride containing gas to (1) remove one or more layers of an oxide of cobalt that is formed at or below the surface of the upper surface of the cobalt plug and (2) remove portions of the cobalt plug below the one or more layers of the oxide to extend the opening into the cobalt plug, performing a defluorination process to remove the fluoride containing gas after the opening has been extended a desired distance into the cobalt plug, forming a recess in the cobalt plug at a bottom of the opening, wherein the recess is spaced from the nitride based etch stop layer, and forming a tungsten plug in the recess and the opening. In some embodiments, the method further includes performing a first implantation operation to implant germanium ions in the second dielectric layer, the germanium ions occupying gaps between sidewalls of the opening in the second dielectric layer and an outer surface of the tungsten plug, and performing a planarization operation to remove portions of the tungsten plug and the second dielectric layer. In some embodiments, the method further includes performing a second implantation operation to implant germanium ions in the second dielectric layer after performing the planarization operation. In some embodiments, the performing etching operation further includes removing portions of the cobalt plug below the one or more layers of the oxide to extend the opening into the cobalt plug. In some embodiments, forming the recess in the cobalt plug includes forming the recess having a width greater than a width of the opening. In some embodiments, the method further includes performing a defluorination process to remove the fluoride containing gas from the opening after the opening has been extended into the cobalt plug.

In accordance with another aspect of the present disclosure, a semiconductor device includes a first dielectric layer disposed over a semiconductor device structure and including a metal layer therein, an etch stop layer disposed over the first dielectric layer, a second dielectric layer disposed over the etch stop layer, a recess in the metal layer and spaced from the etch stop layer, and a tungsten plug. An opening is defined in the second dielectric layer, the etch stop layer, and the metal layer, the tungsten plug is disposed in the opening and the recess, and a width of the recess is greater than a width of the opening. In some embodiments, a distance between the recess and the etch stop layer is between 1 nm to 10 nm. In some embodiments, the second dielectric layer includes germanium. In some embodiments, a width of the opening is between 10 nm to 20 nm, and a width of the recess is between 15 nm to 25 nm. In some embodiments, a height of the recess is between 3 nm to 10 nm. In some embodiments, a distance between an upper surface of the second dielectric layer and an upper surface of the metal layer is between 200 nm to 500 nm. In some embodiments, an aspect ratio of a width of the recess and a height of the recess is between 0.2 to 2, and an aspect ratio of a (1) distance from an upper surface of the second dielectric layer to an upper surface of the metal layer, and (2) a width of the opening is between 12 to 100.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a first dielectric layer over a substrate;
   forming a metal layer in the first dielectric layer;
   forming an etch stop layer on a surface of the first dielectric layer and the metal layer;
   removing portions of the metal layer and the etch stop layer to form a recess in the metal layer, the recess being spaced apart from a bottom surface of the etch stop layer; and
   forming a tungsten plug in the recess, wherein the metal layer includes cobalt, and first portions of the metal layer at or near a surface of the metal layer include an oxide of cobalt, and
   wherein the method further comprises performing an etching operation using a fluoride containing gas to remove the first portions of the metal layer and remove second portions of the metal layer below the first portions to form the recess.

2. The method of claim 1, further comprising:
performing a defluorination process to remove the fluoride containing gas after the recess has been formed a desired distance into the metal layer.

3. The method of claim 2, further comprising:
prior to etching, forming a second dielectric layer on the etch stop layer; and
removing portions of the second dielectric layer and the etch stop layer to form an opening, wherein the recess is formed in the metal layer through the opening.

4. The method of claim 3, further comprising:
performing a first ion implantation operation to implant an ion species in the second dielectric layer; and
performing a planarization operation on the second dielectric layer and the tungsten plug.

5. The method of claim 4, further comprising:
forming a buffing layer on the second dielectric layer prior to performing the planarization operation.

6. The method of claim 4, further comprising:
performing a second ion implantation operation to implant the ion species in the second dielectric layer.

7. The method of claim 3, wherein etching the first portions and the second portions extends the opening into the metal layer.

8. The method of claim 2, wherein the defluorination process is performed using plasmas of argon (Ar), hydrogen ($H_2$), or oxygen ($O_2$).

9. A method of manufacturing a semiconductor device, comprising:
forming a first dielectric layer over a substrate;
forming a cobalt plug in the first dielectric layer;
forming a nitride based etch stop layer on the first dielectric layer and the cobalt plug;
forming a second dielectric layer over the nitride based etch stop layer;
forming an opening in the second dielectric layer and the nitride based etch stop layer to expose an upper surface of the cobalt plug;
performing an etching operation using a fluoride containing gas to (1) remove one or more layers of an oxide of cobalt that is formed at or below the upper surface of the cobalt plug and (2) remove portions of the cobalt plug below the one or more layers of the oxide to extend the opening into the cobalt plug;
performing a defluorination process to remove the fluoride containing gas after the opening has been extended a desired distance into the cobalt plug;
forming a recess in the cobalt plug at a bottom of the opening, wherein the recess is spaced from the nitride based etch stop layer; and
forming a tungsten plug in the recess and the opening.

10. The method of claim 9, further comprising:
performing a first implantation operation to implant germanium ions in the second dielectric layer, the germanium ions occupying gaps between sidewalls of the opening in the second dielectric layer and an outer surface of the tungsten plug; and
performing a planarization operation to remove portions of the tungsten plug and the second dielectric layer.

11. The method of claim 10, further comprising:
performing a second implantation operation to implant germanium ions in the second dielectric layer after performing the planarization operation.

12. The method of claim 11, wherein forming the recess in the cobalt plug includes forming the recess having a width greater than a width of the opening.

13. The method of claim 9, wherein performing the etching operation further includes removing portions of the cobalt plug below the one or more layers of the oxide to extend the opening into the cobalt plug.

14. A method of manufacturing a semiconductor device, comprising:
forming a first dielectric layer over a substrate;
forming a cobalt plug in the first dielectric layer;
forming a nitride based etch stop layer on the first dielectric layer and the cobalt plug;
forming a second dielectric layer over the nitride based etch stop layer;
forming an opening in the second dielectric layer and the nitride based etch stop layer to expose an upper surface of the cobalt plug;
performing an etching operation using a fluoride containing gas to remove portions of the cobalt plug to extend the opening into the cobalt plug a desired distance from a bottom surface of the nitride based etch stop layer;
forming a recess in the cobalt plug at a bottom of the opening, wherein, in a cross-sectional view, the recess has a width that is at least greater than a width of a section of the opening located in the cobalt plug; and
forming a tungsten plug that is located in the recess, the opening, and on an upper surface of the second dielectric layer.

15. The method of claim 14, further comprising
removing the fluoride containing gas to stop the etching operation.

16. The method of claim 14, wherein a distance between an upper surface of the recess and the bottom surface of the nitride based etch stop layer is between 1 nm to 10 nm.

17. The method of claim 14, wherein a width of the opening is between 10 nm to 20 nm, and a width of the recess is between 15 nm to 25 nm.

18. The method of claim 14, wherein a height of the recess is between 3 nm to 10 nm.

19. The method of claim 14, wherein a distance between an upper surface of the second dielectric layer and an upper surface of the cobalt plug is between 200 nm to 500 nm.

20. The method of claim 14, wherein an aspect ratio of a width of the recess and a height of the recess is between 0.2 to 2, and an aspect ratio of a (1) distance from an upper surface of the second dielectric layer to an upper surface of the cobalt plug and (2) a width of the opening is between 12 to 100.

* * * * *